United States Patent
Denholm et al.

[11] Patent Number: 5,911,832
[45] Date of Patent: Jun. 15, 1999

[54] PLASMA IMMERSION IMPLANTATION WITH PULSED ANODE

[75] Inventors: A. Stuart Denholm, Lincoln; Jiqun Shao, Newton, both of Mass.

[73] Assignee: Eaton Corporation, Ohio

[21] Appl. No.: 08/780,808

[22] Filed: Jan. 9, 1997

Related U.S. Application Data

[63] Continuation-in-part of application No. 08/728,000, Oct. 10, 1996, Pat. No. 5,654,043.

[51] Int. Cl.$^6$ .................................................. C23C 16/00
[52] U.S. Cl. ................ 118/723 E; 156/345; 204/298.02; 204/298.31
[58] Field of Search .............................. 118/723 E, 50.1; 156/345; 204/298.02, 298.31

[56] References Cited

U.S. PATENT DOCUMENTS

| | | |
|---|---|---|
| 4,434,036 | 2/1984 | Hoerschelmann et al. |
| 4,764,394 | 8/1988 | Conrad . |
| 5,289,010 | 2/1994 | Shohet . |
| 5,346,600 | 9/1994 | Nieh et al. ............................ 204/192.3 |
| 5,354,381 | 10/1994 | Sheng ................................ 118/723 E |
| 5,449,920 | 9/1995 | Chan . |
| 5,558,718 | 9/1996 | Leung . |
| 5,565,036 | 10/1996 | Westendorp et al. ............ 118/723 MP |
| 5,572,038 | 11/1996 | Sheng . |
| 5,580,384 | 12/1996 | Thiebaud et al. .................... 118/723 E |
| 5,605,576 | 2/1997 | Sasaki et al. ......................... 118/723 E |
| 5,614,055 | 3/1997 | Fairbain et al. .......................... 156/345 |
| 5,647,912 | 7/1997 | Kaminishizono et al. ............ 118/719 |
| 5,680,013 | 10/1997 | Dornfest et al. .................... 315/111.21 |
| 5,682,400 | 10/1997 | Krasnov ..................................... 372/82 |
| 5,698,062 | 12/1997 | Sakamoto et al. ....................... 156/345 |

FOREIGN PATENT DOCUMENTS

| | | |
|---|---|---|
| 0 747 927 A2 | 12/1996 | European Pat. Off. . |
| 0 747 927 A3 | 2/1998 | European Pat. Off. . |
| 44 32 156 | 3/1996 | Germany . |
| 01185918 | 7/1989 | Japan . |
| 2-070066 | 3/1990 | Japan . |
| 03102755 | 4/1991 | Japan . |

(List continued on next page.)

OTHER PUBLICATIONS

Yu, Crid, Semiconductor Processing with Plasma Implantation, *Nuclear Inastruments and Methods in Physics Research*, B79, pp. 655–658 (1993).

Quian, X.Y., "A Plasma Immersion Ion Implantation Reactor for ULSI Fabrication," *Nuclear Instruments and Methods in Physics Research* B55, pp.884–887 (1991).

(List continued on next page.)

*Primary Examiner*—R. Bruce Breneman
*Assistant Examiner*—Luz Alejandro
*Attorney, Agent, or Firm*—Watts, Hoffmann, Fisher & Heinke Co., LPA

[57] ABSTRACT

Method and apparatus for treating a workpiece implantation surface by causing ions to impact the workpiece implantation surface. An implantation chamber defines a chamber interior into which one or more workpieces can be inserted and includes a conductive inner wall portion in proximity to the chamber interior. A conductive workpiece support extends into an interior region of the implantation chamber. A conductive electrode is disposed within said implantation chamber relative to said conductive workpiece support to allow workpieces to be placed on the workpiece support in a region between the support and the conductive electrode. Gas molecules are injected into the implantation chamber to cause the gas molecules to occupy a region of the implantation chamber in close proximity to the one or more workpieces. The gas molecules are ionized near an implant surface of the workpieces. Control circuitry pulses the conductive electrode to a positive potential relative to the conductive workpiece support, the one or more workpieces, and the conductive wall portion of the implantation chamber. The control circuitry includes a voltage source that provides an electric field through which the ionized gas molecules accelerate before striking the implantation surfaces of the one or more workpieces.

12 Claims, 5 Drawing Sheets

FOREIGN PATENT DOCUMENTS

| | | |
|---|---|---|
| 07086603 | 3/1995 | Japan . |
| 07130314 | 5/1995 | Japan . |
| 08274344 | 10/1996 | Japan . |
| WO 93/18201 | 9/1993 | WIPO . |

OTHER PUBLICATIONS

Xia, Z., "Cathodic Arc Ion Implantation for Semiconductor Devices," *Journal of Vacuum Science & Technology* B13, pp. 1999–2003 (1995).

Cheung, N. W., "Plasma Immersion Ion Implantation for Electronic Materials Applications," *International Conference on Solid State Devices and Materials*, Aug. 21, Tokyo, JP pp. 351–353 (1995).

Cheung, Nathan W., Plasma Immersion Ion Implantation for ULSI Processing, *Nuclear Instruments and Methods in Physics Research*, B55, pp. 811–820 (1991).

Hinson, Dr. David C., *The Basics of Plasmas*, Materials Research Corporation, pp. I–1 to I–36 (1984).

Lieberman, Michael A., et al., *Principles of Plasma Discharges and Materials Processing*, John Wiley & Sons, Inc., pp. 526–539 (1994).

PLASMA IMMERSION IMPLANTATION WITH PULSED ANODE

CROSS-REFERENCE TO RELATED APPLICATIONS

This is a continuation-in-part of application Ser. No. 08/728,000, now U.S. Pat. No. 5,654,043 filed on Oct. 10, 1996.

FIELD OF THE INVENTION

The present invention concerns an ion implantation system that treats a workpiece with an ion impurity by immersing the workpiece in an ion plasma and accelerating ions within the plasma to implant the workpiece.

BACKGROUND ART

Commercially available ion implantation systems employ an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically circular wafers that have been placed within the implantation chamber. The energy of the ion beam is sufficient to cause ions which strike the wafers to penetrate those wafers in the implantation chamber. In a typical application of such a system the wafers are silicon wafers and the ions are used to 'dope' the wafers to create a semiconductor material. Selective implantation with the use of masks and passivation layers allows an integrated circuit to be fabricated with such a prior art implanter. The equipment for this implantation technique is large, complex, expensive, and limited in its ability to implant ions at low energies.

U.S. Pat. No. 4,764,394 to Conrad entitled "Method and Apparatus for Plasma Source Ion Implantation" discloses an ion implantation system for treating a target by means of ionic bombardment. Ion implantation into surfaces of a three dimensional target is achieved by forming an ionized plasma about the target within an enclosing chamber. Once the plasma is set up in a region surrounding the target, ions from the plasma are driven into the target object from all sides without need to scan the target trough an ion beam. This implantation is accomplished by applying repetitive high voltage negative pulses to the one or more target workpieces. These pulses cause the ions to be driven into exposed surfaces of the target. A technique discussed in the '394 patent for setting up the plasma is to introduce a neutral gas into the region of the target and then ionize the gas with ionizing radiation. The system disclosed in the '394 patent to Conrad sets up the plasma in a region surrounding the workpiece and then selectively pulses an electrode that supports the workpiece to attract the charged ions in the plasma to the workpiece.

Theoretical studies of the plasma implementation process by Lieberman indicate that when a sudden negative voltage is applied to a target workpiece, within nanoseconds electrons near the surface are driven away from a region surrounding the workpiece, leaving a uniform density ion matrix sheath. M. A. Lieberman, "Model of Plasma Immersion Ion Implantation," J. Applied Physics, 66 (1989) p. 2926. Subsequently, on the time scale of the inverse ion plasma frequency, ions within the sheath are accelerated into the one or more workpieces. This in turn, drives the sheath boundary further from the target workpiece, exposing more ions which are driven into the workpiece. On a larger time scale, a steady state ion space charge condition typically develops. Sheathes of about one centimeter thickness are developed within microseconds. See, e.g., M. M. Shamim et al, "Measurement of Electron Emission due to Energetic Ion Bombardment in Plasma Source Ion Implantation," J. Applied Physics, 70 (1991) p. 4756.

The electric field within the plasma is low and substantially all of the potential applied to the target to accelerate the ions exists across the sheath. Typically, secondary electrons are produced as ions from the plasma strike the target surface. These electrons are accelerated from the target through the voltage drop across the sheath and terminate at the walls of the enclosing chamber. For a general discussion of secondary emission coefficients, see, e.g., S. Qin et al, "The Response of a Microwave Multipolar Bucket Plasma to a High Voltage Pulse with Finite Rise Time," IEEE Trans. Plas., Sci, 20 (1992) p. 569.

Some ion implantation systems, such as disclosed in Conrad, maintain the implantation chamber at a ground potential while pulsing the target workpiece with a relatively negative potential. For a substantially flat target workpiece requiring treatment on one face, such as a semiconductor wafer or a flat panel display substrate, the negatively pulsed target ion implantation system may be unfavorable. In such ion implantation systems, the target workpiece typically has to be raised to a high negative potential. This makes handling of the workpiece more difficult and complicates monitoring the potential delivered to charge collectors at the target workpiece by such monitoring devices as Faraday cups or calorimeters, since these devices also experience the high negative potential.

DISCLOSURE OF THE INVENTION the present invention provides a new and improved method and apparatus for ion implantation of a target workpiece. According to the present invention the target workpiece is maintained at a reference potential and an electric field near the surface of the workpiece is developed by pulsing a conductive electrode near the workpiece with positive voltage pulses.

To reduce power consumption the surface area within the implantation chamber having a potential negative relative to the positively pulsed electrode is reduced. The total current needed for implantation is reduced and accordingly the total amount of power required for implantation is also reduced.

in the preferred embodiment of the invention, on or more workpieces are supported by a conductive workpiece support which supports the one or more workpieces within an interior region of an implantation chamber. The implantation chamber includes a conductive inner wall portion in proximity to the chamber interior. A conductive electrode is also disposed within the implantation chamber and positioned relative to the conductive workpiece support. Neutrally charged gas molecules are injected into the implantation chamber and subsequently ionized so that an ionized gas, or ion plasma, is formed near the implantation surface of the workpiece. According to a feature of the present invention, the conductive workpiece support, the workpiece, and the conductive wall portion of the implantation chamber are all maintained at a reference potential. The conductive electrode is then pulsed with pulses that are positive in relation to this reference potential to provide an electric field through with ions formed from the gas molecules accelerate before striking the implantation surface of the workpiece.

Since the development of the required plasma conditions for ion implantation is determined by the electric field near or at the surface of the workpiece, efficiency can be improved by substantially shielding the surfaces that are relatively positively pulsed but do not directly oppose the workpiece. In the preferred embodiment, the electrode is shielded with a dielectric so that electric field lines associated with the electrode become concentrated within the electrode as the pulse develops and not within the chamber interior in close proximity to the dielectric. Alternatively, the dielectric can be covered in a casing that is maintained at the reference potential.

Efficiency can also be improved by shielding the surfaces that are maintained at the reference potential but that are not required to develop the electric field at the surface of the target workpiece. In the preferred embodiment of the invention, the conductive wall portion of the implantation chamber and the conductive workpiece support are shielded with a dielectric, thereby effectively reducing the amount of exposed surface area within the implantation chamber having a negative potential relative to the electrode.

Because the workpiece is at ground potential, the disclosed invention facilitates handling, mechanical scanning or other movement of the workpiece support and workpiece to improve uniformity of the ion implantation dose. The present invention also simplifies target cooling and monitoring the implantation dose since devices such as Faraday cups or calorimeters used to measure dose are maintained at the reference potential.

These and other objects, advantages, and features of the invention will be better understood from the accompanying detailed description of a preferred embodiment of the invention when reviewed in conjunction with the accompanying drawings.

BEST MODE FOR PRACTICING THE INVENTION

Figure 1:
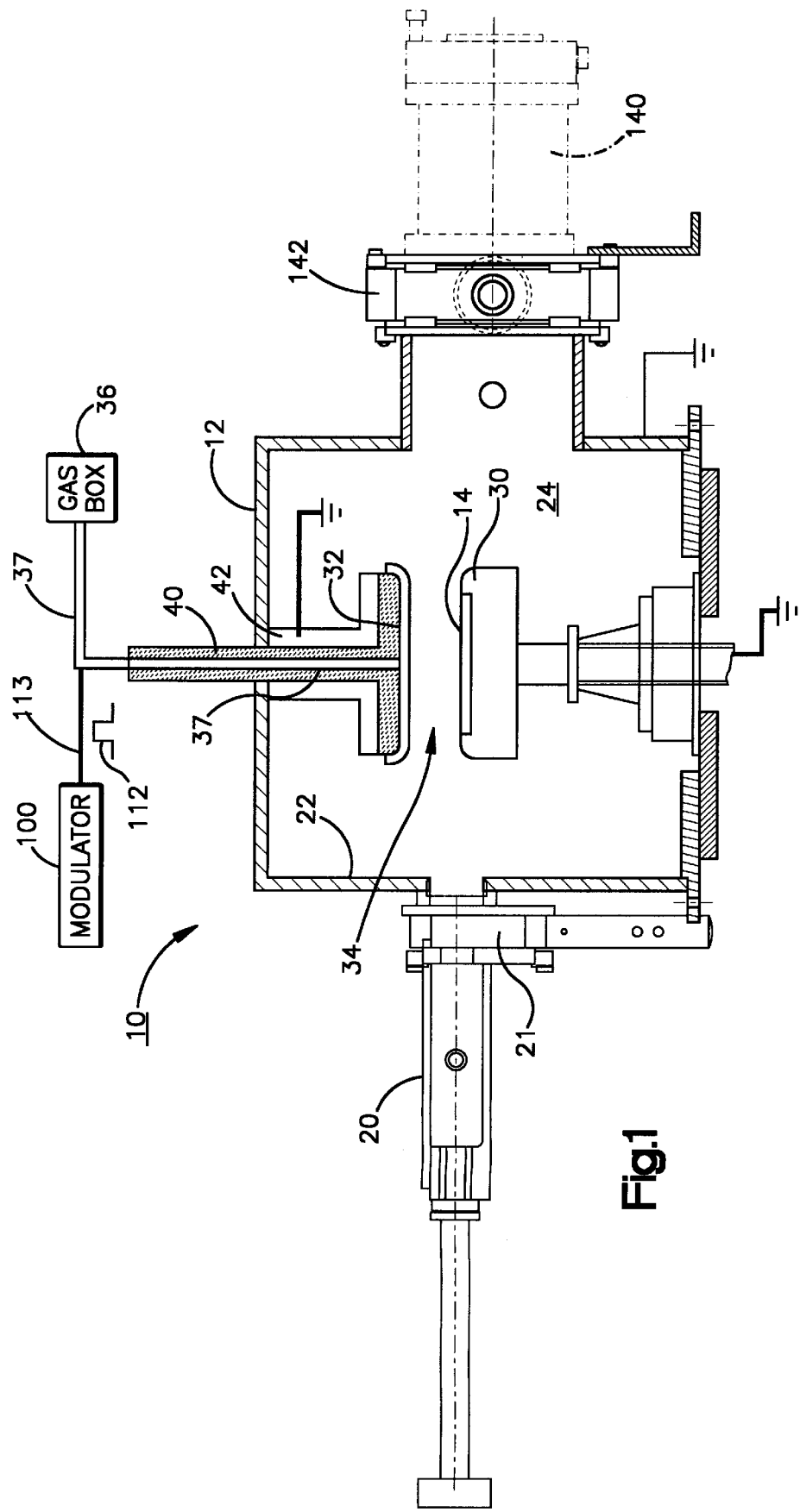
FIG. 1 is a schematic of an ion implantation system constructed in accordance with a preferred embodiment of the present invention.

FIG. 1 is an overview schematic of an ion implantation system 10 that includes a process chamber 12 into which generally planar workpieces are inserted for ion treatment of those workpieces. One use of the disclosed system is for ion implantation of silicon wafers during fabrication of integrated circuits. The system depicted in FIG. 1 includes a loadlock 20 for inserting individual wafers into the process chamber 12 one at a time. The use of a loadlock allows the process chamber 12 to be maintained at a reduced pressure (in relation to atmospheric pressure) as workpieces are placed into and withdrawn from the chamber 12 through a valve 21 that is opened and closed as workpieces are inserted into and retrieved from the process chamber.

The process chamber 12 depicted in FIG. 1 has inner walls 22 that define a chamber interior 24 into which a workpiece 14 has been inserted. The workpiece 14 is placed onto a generally planar conductive platen or support 30. The platen may have any suitable dimensions depending, for example, on the size of the workpiece to be supported.

Spaced above the workpiece platen is a gas delivery manifold 32 that injects an ionizable gas into a region 34 between the manifold and the workpiece 14. An ion plasma is created in this region 34 during operation of the implantation system 10.

A gas supply 36 outside the chamber 12 delivers an ionizable gas through a conduit 37 passing through a chamber wall into the manifold 32. The manifold 32 defines multiple diverging passageways leading from the conduit 37 to an array of openings (not shown) facing the workpiece 14. Good treatment uniformity is obtained by keeping the gas density in the region 34 between the manifold and the workpiece 14 as uniform as possible. A preferred manifold 32 is generally circular in plan and includes an array of openings spaced to maintain the gas concentration as uniform as possible around the outer perimeter of the manifold 32. In this regard, the workpieces 14 are placed onto the platen 30 spaced inwardly from the edge of the generally circular platen 30 to avoid potentially non-uniform regions of the plasma. Uniform implantation may also be promoted by suitable design of the shape of the edges of the platen 30 and the manifold 32 to control the electrical field strength at the edges of these members.

Once the gas enters the plasma region 34 the gas molecules are ionized (stripped of one or more electrons) and the positively charged atoms are accelerated toward the workpiece 14 by a sequence of positive voltage pulses that are applied to the manifold 32 while the conductive platen 30 is maintained at a ground potential. In the disclosed embodiment a single workpiece 14 is shown supported on the platen 30, but multiple workpieces 14 could also be simultaneously implanted using the present invention.

FIG. 1 shows the relative biasing arrangement used for creating a concentration of workpiece treatment material in the region 34 above the workpiece 14. The conductive support platen 30, the workpiece 14, and the chamber walls 22 are all grounded. Positive voltage pulses are applied to the manifold 32 to cause ions to be created by the relatively high electric field in the region 34 and accelerated toward the platen 30.

A modulator circuit 100 located outside the chamber 12 applies voltage pulses to the manifold 32. The manifold 32 accordingly acts as one electrode and the platen 30 as another electrode. Any one of a number of commercially acceptable voltage sources are suitable for supplying appropriate voltage pulses. As one example, the source can be constructed using a high power IGFET assembly for starting the voltage pulse upon switch closing and stopping the voltage pulse upon switch opening. The pulses 112 are applied by means of a conductor 113 electrically coupled to the conduit 37 which in a preferred embodiment of the invention is constructed from a conductive material. Alternately, the pulses could be directed through an insulated conductor passing through a wall of the chamber and coupled directly to the manifold 32.

A preferred modulator circuit 100 includes a voltage source that provides a sequence of pulses 112 that both ionize the gas molecules injected into the chamber and accelerate the ionized gas molecules toward implantation surfaces of the one or more workpieces 14. The repetition rate and pulse duration of the pulses 112 are chosen to assure that a glow discharge is developed and a plasma is formed and maintained in the region 34 by the pulses applied to the manifold 32. The plasma density can decay in a time on the order of milliseconds due to recombination and diffusion after the ionization pulse is removed. TO maintain the plasma continuously, a pulse rate of thousands per second or greater is necessary. However, at lower pulse rates, the ionization and implantation are still occurring during each pulse but provide a lower implantation rate.

To help reduce contamination, the platen 30 and the manifold 32 for one embodiment are formed of aluminum coated by silicon. Lining at least a portion of the chamber walls 22 and/or the non-working area of the platen 30 with a suitable insulating material, such as quartz for example, also helps to reduce contamination as well as power consumption.

Use of a loadlock 20 for inserting the workpiece 14 into the chamber allows the interior of the chamber 12 to remain evacuated between implants. A vacuum pump 140 maintains the chamber interior at a reduced pressure that is regulated by a valve 142 placed between the chamber 12 and the pump 140.

Electric field lines associated with the positively pulsed manifold 32 are generally directed to the surface area, including that of the workpiece 14, within the implantation chamber 12 having a negative potential relative to the manifold 32. Efficiency may be improved by shielding the manifold and the delivery conduit with an insulating dielectric 40, and a conductive casing 42 maintained at reference potential. This shielding covers those portions of the positively pulsed manifold 32 which do not face the manifold 32 and are therefore not necessary to develop the electric field near or at the surface of the workpiece 14. Shielding the manifold 32 concentrates the electric field lines within the region 34 between the manifold 32 and the work 14 and substantially reduces the electric field strength elsewhere within the interior region 24 of the chamber 12.

Use of the dielectric 40 substantially reduces the load driven by the modulator circuit 100, thereby reducing the power consumed by the modulator circuit 100. With the casing 42, the electric field associated with conduit 37 is contained within the dielectric 40 and hence does not generate a load associated with accelerating ions and electrons. If the casing 42 is not used, shielding is still obtained but less efficiently. With the casing 42, the outer surface of the dielectric 40 is approximately maintained at ground potential by electrons flowing form the plasma.

Figure 1A:
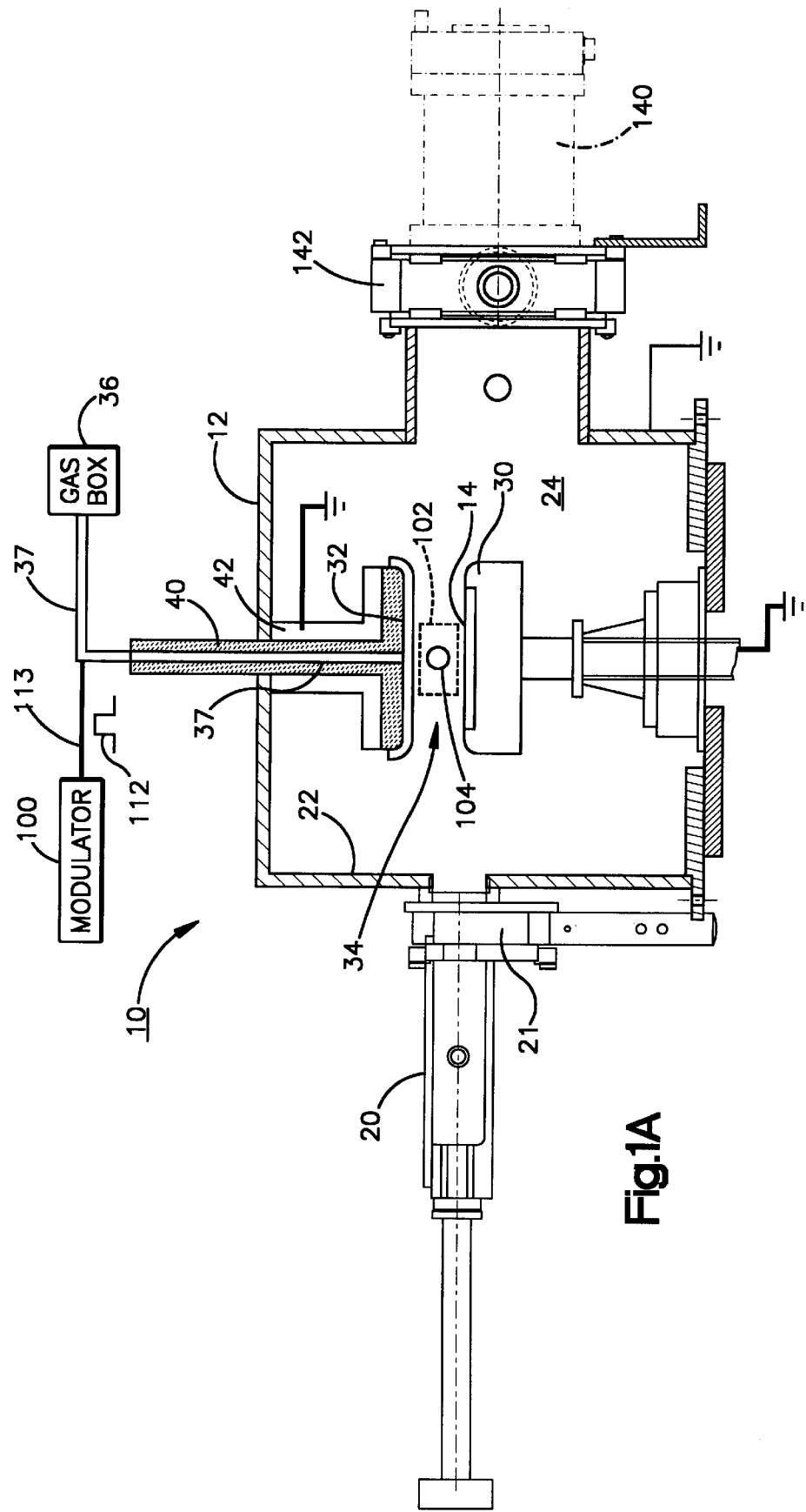
FIG. 1A is a schematic of the ion implantation system of FIG. 1 that includes an ultraviolet source to help ionize gas molecules within an implantation chamber.

FIG. 1A illustrates an implant system 10 that includes an ultraviolet light source 102 for enhancing ion creation with the chamber 12. The chamber 12 includes a window 104 that is transmissive to the passage of ultraviolet light from the source 102. The ultraviolet light passes into the chamber 12 to a region between the manifold 32 and the platen 30 and helps promote ionization of gas atoms entering the chamber through the manifold 32 in an ionization region near the workpiece 14.

Figure 2:
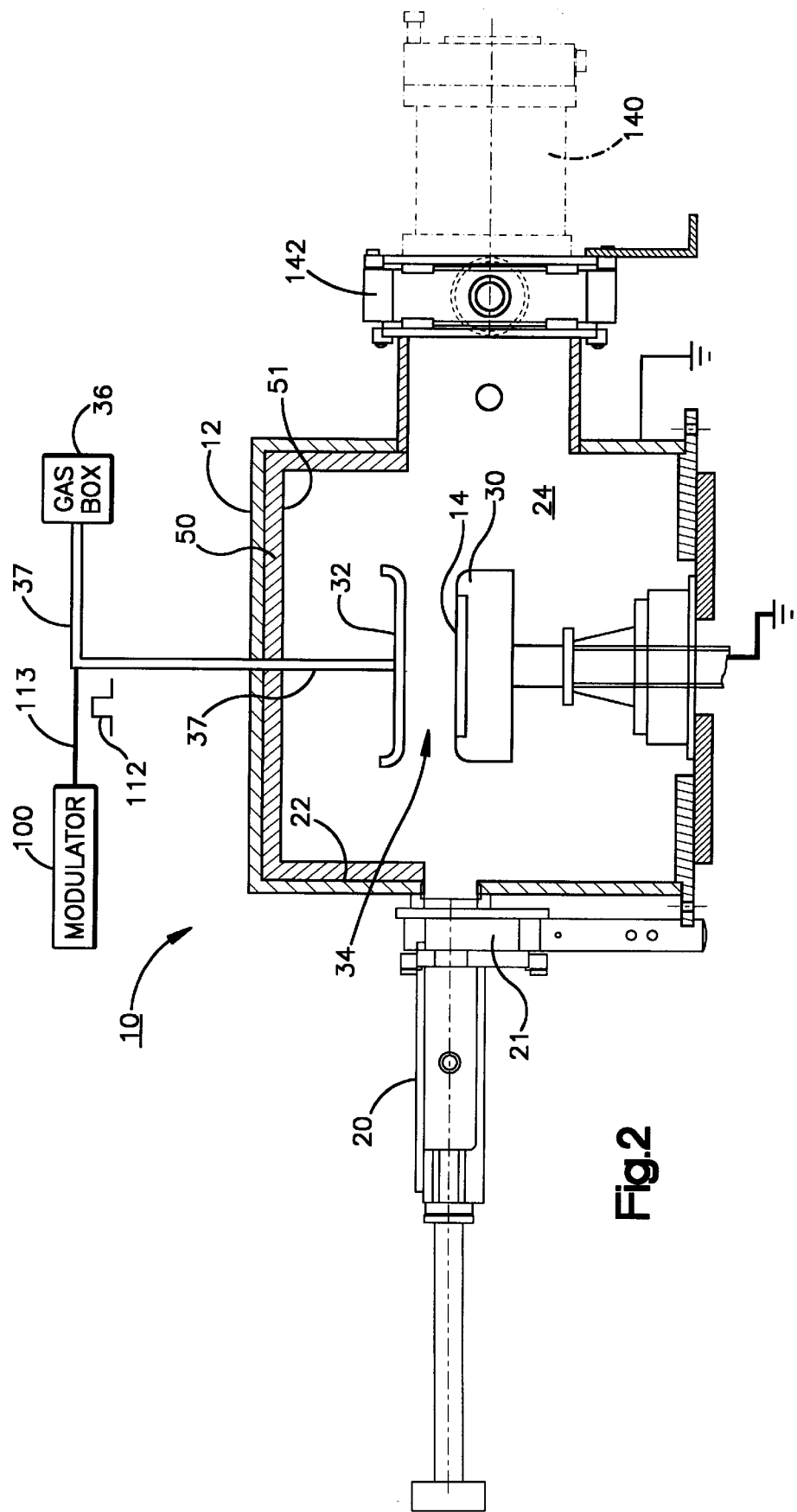
FIG. 2 is a schematic of an ion implantation system constructed in accordance with another embodiment of the present invention.

Efficiency can also be improved by shielding the surface areas of the chamber 12 which are maintained at a negative potential relative to the positively pulsed manifold 32 and which are not necessary to develop the electric field near or at the surface of the workpiece 14. As shown in FIG. 2, a dielectric 50 may be used to shield a portion of the inner walls 22 of the chamber 12. An internal surface 51 of the dielectric 50 is positively charged to the same voltage as the manifold 32, by positive ions striking, and secondary electrons leaving, the dielectric surface 51. The dielectric 50 substantially inhibits the electric field from passing into the ion plasma near or at the dielectric surface 51, and, as a result, the region in which gas molecules are ionized are accelerated is substantially reduced and the corresponding load drawn on the modulator 100 is also reduced.

Figure 3:
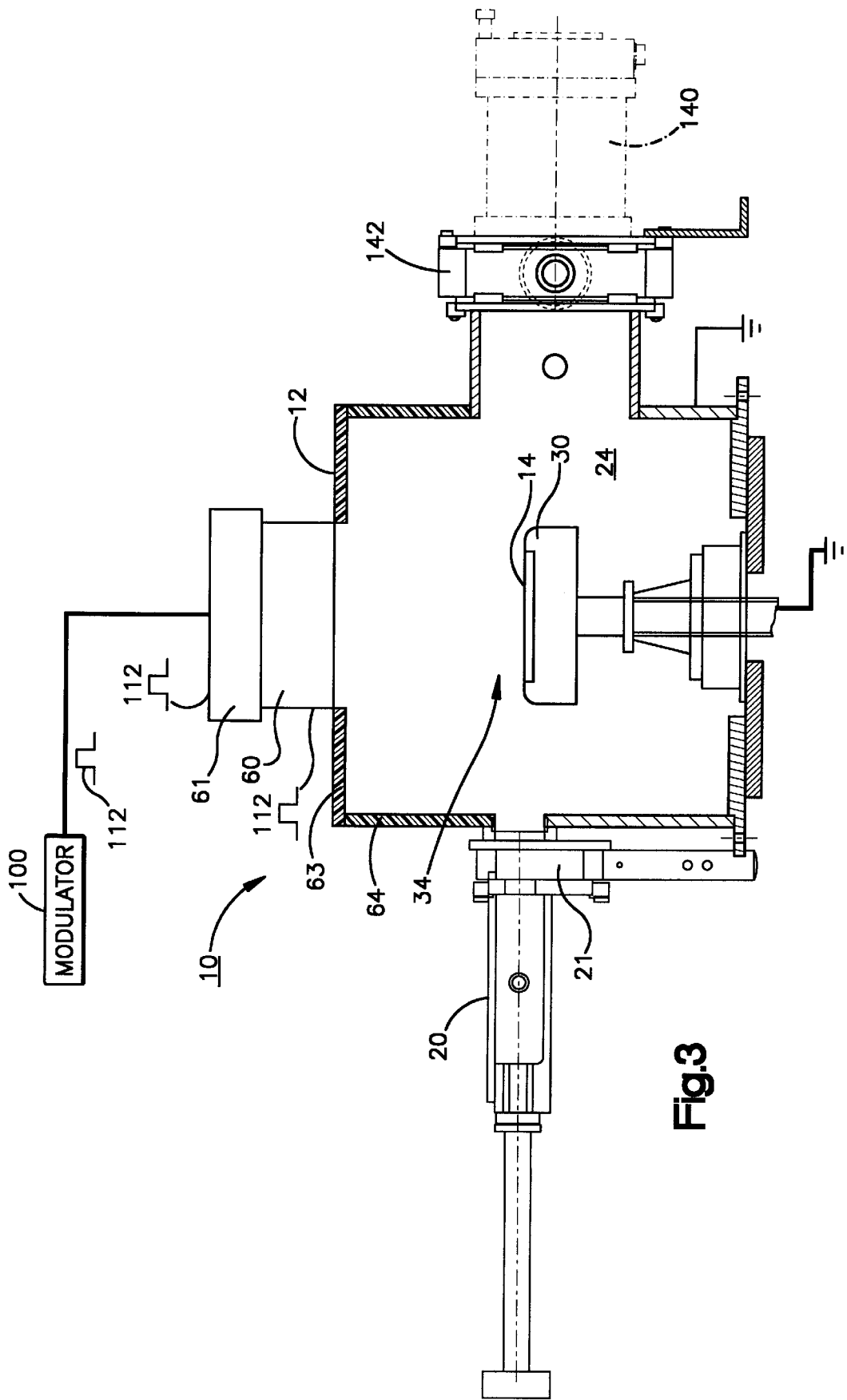
FIG. 3 is a schematic of an ion implantation system constructed in accordance with another embodiment of the present invention; and, FIG. 4 is a schematic of an ion implantation system constructed in accordance with another embodiment of the present invention.

FIG. 3 shows another ion implantation system constructed in accordance with the present invention. This system reduces the amount of surface area within the implantation chamber 12 having a negative potential relative to the positively pulsed manifold 32. In this embodiment, parts of the ion implantation system 10 are positively pulsed. As shown in FIG. 3, and ion source 60 and a source 61 of ionizable material delivered to the source 60 are positively pulsed to a high potential by the modulator 100. The source 60 can include one of a number of commercially available sources such as an inductively coupled plasma (ICP), helicon, ECR or microwave source. An insulator plate 63 and insulator ring 64 isolate the positively pulsed portions of the implantation system 10 from the surface area of the workpiece 14 having a relatively negative potential.

Figure 4:
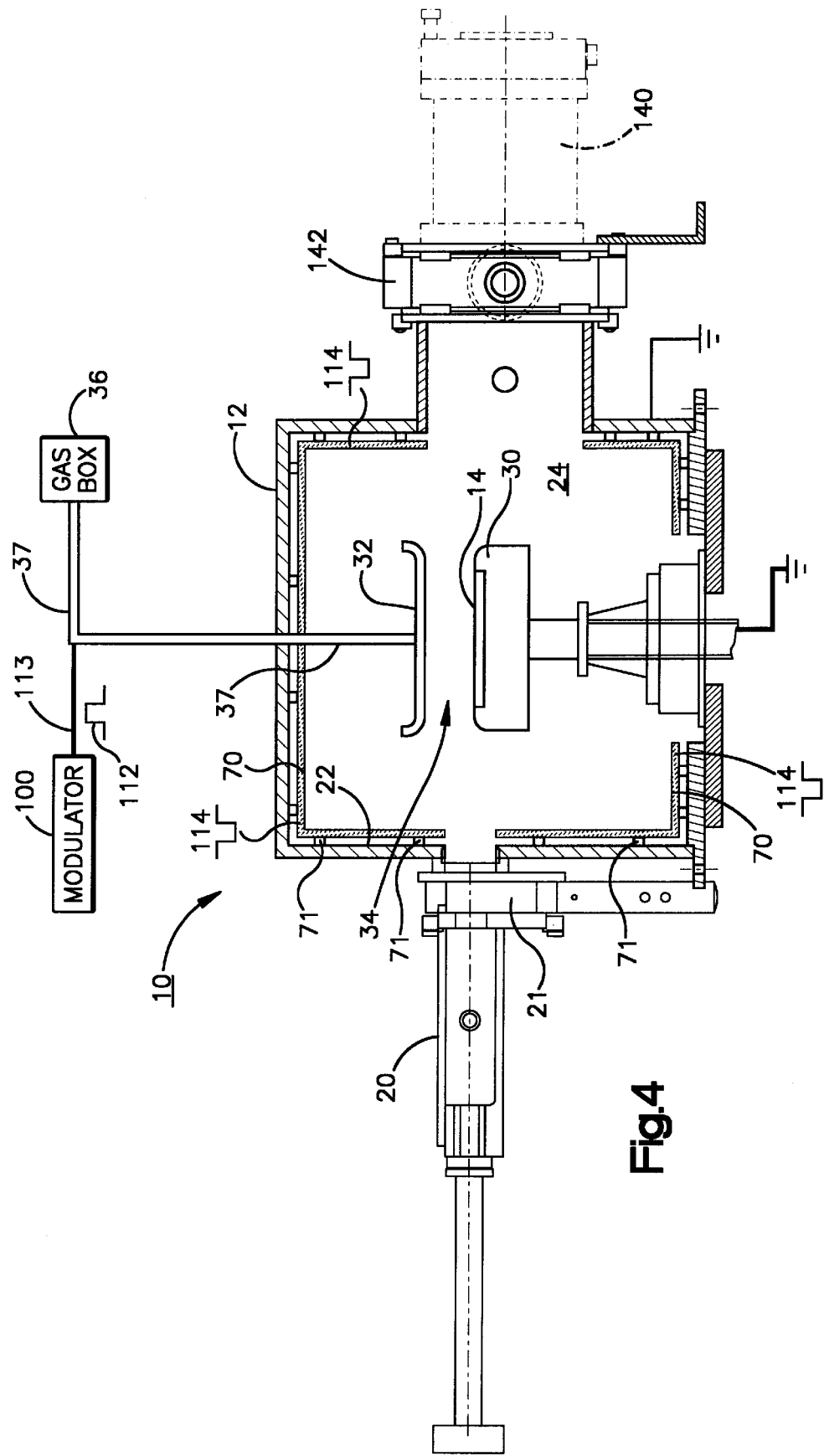

The load on the modulator 100 can also be reduced by using biased grids to shield selected surface areas subject to a negative potential relative to the manifold 32. In this embodiment, as shown in FIG. 4, metallic grids 70 are positioned parallel to, and approximately 1 cm from the surface of the inner walls 22 of the chamber 12. Insulator spacers, or standoffs 71, isolate the grids 70 from the chamber walls 22. The grids 70, which are electrically connected to each other, are biased negatively 114 relative to the inner walls 22 so that secondary electrons produced at the surface of the walls 22 by ion bombardment are substantially suppressed by the biasing grids 70. In accordance with the invention, when a high voltage is applied, the electric field strength near the surface of the grids 70 is several times higher than if the inner walls 22 are without grids 70, but as the plasma sheathe expands away from the grids 70, the field strength at the sheath boundary assumes normal levels and the sheathe expansion normal velocities. Without a grid 70, positive ions striking surfaces having a negative potential relative to the manifold 32 produce secondary electrons with a coefficient of electrons to ions of as high as five. With a grid 70, a low bias voltage would be sufficient to reduce the related secondary electron load current. In effect the grid reduces the surface area for electron emission. The bias voltage required to reduce the secondary electron load could be quite small, in the range of about 50 to 150 volts, depending on the geometries chosen.

While alternate embodiments of the present invention has been described with a degree of particularity, it is the intent that the invention include all modifications and alterations from the disclosed design falling within the spirit or scope of the pending claims.

We claim:

1. Apparatus for treating a workpiece implantation surface by causing ions to impact the workpiece implantation surface comprising:

a) an implantation chamber defining a chamber interior into which one of more workpieces can be inserted and including a conductive inner wall portion in proximity to the chamber interior;

b) a conductive workpiece support that extends into an interior region of the implantation chamber;

c) a conductive electrode disposed within said implantation chamber, relative to said conductive workpiece support, as to allow workpieces to be placed on the workpiece support in a region between the support and the conductive electrode;

d) means for injecting neutrally charged gas molecules into the implantation chamber to cause the gas molecules to occupy a region of the implantation chamber in close proximity to the one or more workpieces;

e) means for ionizing the gas molecules so that an ionized gas is formed near the implantation surfaces of said one or more workpieces;

f) means for maintaining the conductive workpiece support and the conductive wall portion of the ion implantation chamber at a same reference potential;

g) control circuitry for electrically pulsing the conductive electrode to a positive potential relative to the conductive workpiece support, the one or more workpieces, and the conductive wall portion of the implantation chamber; said control circuitry including a voltage source that provides and electric field through which the ionized gas molecules accelerate before striking the implantation surfaces of the one or more workpieces.

2. The apparatus of claim 1 wherein the voltage source includes a solid state switch for starting the voltage pulse upon switch closing and stopping the voltage pulse upon switch opening.

3. The apparatus of claim 1 further comprising a dielectric to substantially shield said electrode so that electric field lines associated with said electrode pass through the dielectric and not into said ionized gas in proximity to said electrode.

4. The apparatus of claim 3 further comprising a casing to substantially shield an external portion of said dielectric.

5. The apparatus of claim 4 further compromising means for maintaining said casing at a reference potential relative to said positive potential.

6. The apparatus of claim 1 wherein the interior chamber defines a predetermined amount of surface area and wherein the conductive workpiece support includes a dielectric for shielding a surface of the support, thereby reducing the predetermined amount of surface area within said implantation chamber having a negative potential relative to said electrode and to which the ionized gas molecules are implanted.

7. The apparatus of claim 6 further comprising a dielectric to shield a surface of the conductive inner wall portion of the implantation chamber, thereby reducing the predetermined amount of surface area within said implantation chamber having a negative potential relative to said electrode and to which the ionized gas molecules are implanted.

8. The apparatus of claim 6 further comprising a dielectric to shield an internal region of said conductive inner wall portion so that ionized gas molecules striking and secondary electrons leaving a surface of the region cause the dielectric to attain about the same positive potential as that of said electrode, thereby reducing the predetermined amount of surface area within said implantation chamber having a negative potential relative to said electrode and to which the ionized gas molecules are implanted.

9. The apparatus of claim 6 wherein the implantation chamber further includes an insulator to separate an ion source from the conductive inner wall portion of said implantation chamber and wherein the ion source is electrically pulsed to a relatively positive potential about the same as that of said electrode, thereby reducing the predetermined amount of surface area within said implantation chamber having a negative potential relative to said electrode and to which the ionized gas molecules are implanted.

10. The apparatus of claim 6 further comprising a negatively biased metallic grid spaced from the conductive inner wall portion of the implantation chamber to shield the conductive inner wall portion, thereby reducing the predetermined amount of surface area within said implantation chamber having a negative potential relative to said electrode and to which the ionized gas molecules are implanted.

11. The apparatus of claim 10 further comprising means for relatively biasing a surface of said metallic grid so that secondary electrons produced at the conductive inner wall portion are substantially suppressed, thereby reducing the predetermined amount of surface area within said implantation chamber having a negative potential relative to said electrode and to which the ionized gas molecules are implanted.

12. The apparatus of claim 1 further comprising an ultraviolet source for causing ultraviolet energy to pass through a region of the implantation chamber near the one or more workpieces.

* * * * *